United States Patent
Shidla et al.

(10) Patent No.: US 7,469,370 B2
(45) Date of Patent: Dec. 23, 2008

(54) ENABLING MULTIPLE TESTING DEVICES

(75) Inventors: Dale J. Shidla, Roseville, CA (US); Andrew H. Barr, Roseville, CA (US); Jacky Tsun-Yao Chang, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 861 days.

(21) Appl. No.: 10/328,805

(22) Filed: Dec. 23, 2002

(65) Prior Publication Data

US 2004/0123196 A1   Jun. 24, 2004

(51) Int. Cl.
- G01R 31/28 (2006.01)
- G06F 11/00 (2006.01)
- G06F 3/00 (2006.01)

(52) U.S. Cl. .......................... 714/724; 714/30; 710/17

(58) Field of Classification Search ................ 714/724, 714/27, 36; 710/8–14, 128–129, 62–64, 710/102; 364/240, 579; 702/119, 120; 713/1, 713/2
See application file for complete search history.

(56) References Cited

U.S. PATENT DOCUMENTS

| | | | |
|---|---|---|---|
| 5,426,649 A | 6/1995 | Bllecha, Jr. | |
| 5,790,465 A | 8/1998 | Roh et al. | |
| 5,799,021 A | 8/1998 | Gheewala | |
| 6,311,292 B1 * | 10/2001 | Choquette et al. | 714/30 |
| 6,330,622 B1 * | 12/2001 | Schaefer | 710/8 |
| 6,425,100 B1 | 7/2002 | Bhattacharya | |
| 6,584,590 B1 * | 6/2003 | Bean | 714/724 |
| 6,751,569 B2 * | 6/2004 | Merkin et al. | 702/120 |

\* cited by examiner

*Primary Examiner*—Cynthia Britt
*Assistant Examiner*—John J Tabone, Jr.

(57) ABSTRACT

A method for enabling multiple testing devices within a system. The method may include determining whether a first testing device or a second testing device is coupled to the system. Provided the first testing device is coupled to the system, the method may include enabling the first testing device to operate with an interface of the system capable of coupling to a device under test. Provided the second testing device is coupled to the system, the method may include enabling the second testing device to operate with the interface of the system.

27 Claims, 5 Drawing Sheets

ENABLING MULTIPLE TESTING DEVICES

BACKGROUND ART

Computers have become integral tools used in a wide variety of different applications, such as in finance and commercial transactions, computer-aided design and manufacturing, health care, telecommunication, education, etc. Computers are finding new applications as a result of advances in hardware technology and rapid development in software technology. Furthermore, the functionality of a computer system is dramatically enhanced by coupling these types of stand-alone devices together in order to form a networking environment. Within a networking environment, users may readily exchange files, share information stored on a common database, pool resources, and communicate via electronic mail (e-mail) and video teleconferencing. Furthermore, computers which are coupled to a networking environment like the Internet provide their users access to data and information from all over the world.

Moreover, along with the advancement of computers, there are technologies and equipment that manufacturers and developers utilize in order to produce computers, servers and the like. For example, it is appreciated that Intel's In-Target Probe (ITP) and JTAG's boundary-scan are industry standard technologies for performing in-system testing, configuration, and debug. In order to utilize either of these technologies, the user typically configures the desired system for ITP or JTAG boundary-scan prior to using the appropriate tool. Since ITP and JTAG boundary-scan are development, debug, and test validation tools used in systems development and manufacturing, this presents some disadvantages.

For example, one disadvantage is that there is increased time typically needed in order to configure a system to use either tool. Another disadvantage is that modifications to system hardware and/or software are commonly needed in order to use either tool. Furthermore, there is an increased risk associated with damaging the system due to the mentioned hardware modifications.

Accordingly, a need exists for a way to enable ITP and JTAG boundary-scan to be utilized on a system without user intervention or changes to hardware and/or software.

DISCLOSURE OF THE INVENTION

A method for enabling multiple testing devices within a system. The method may include determining whether a first testing device or a second testing device is coupled to the system. Provided the first testing device is coupled to the system, the method may include enabling the first testing device to operate with an interface of the system capable of coupling to a device under test. Provided the second testing device is coupled to the system, the method may include enabling the second testing device to operate with the interface of the system.

MODE(S) FOR CARRYING OUT THE INVENTION

Figure 1:
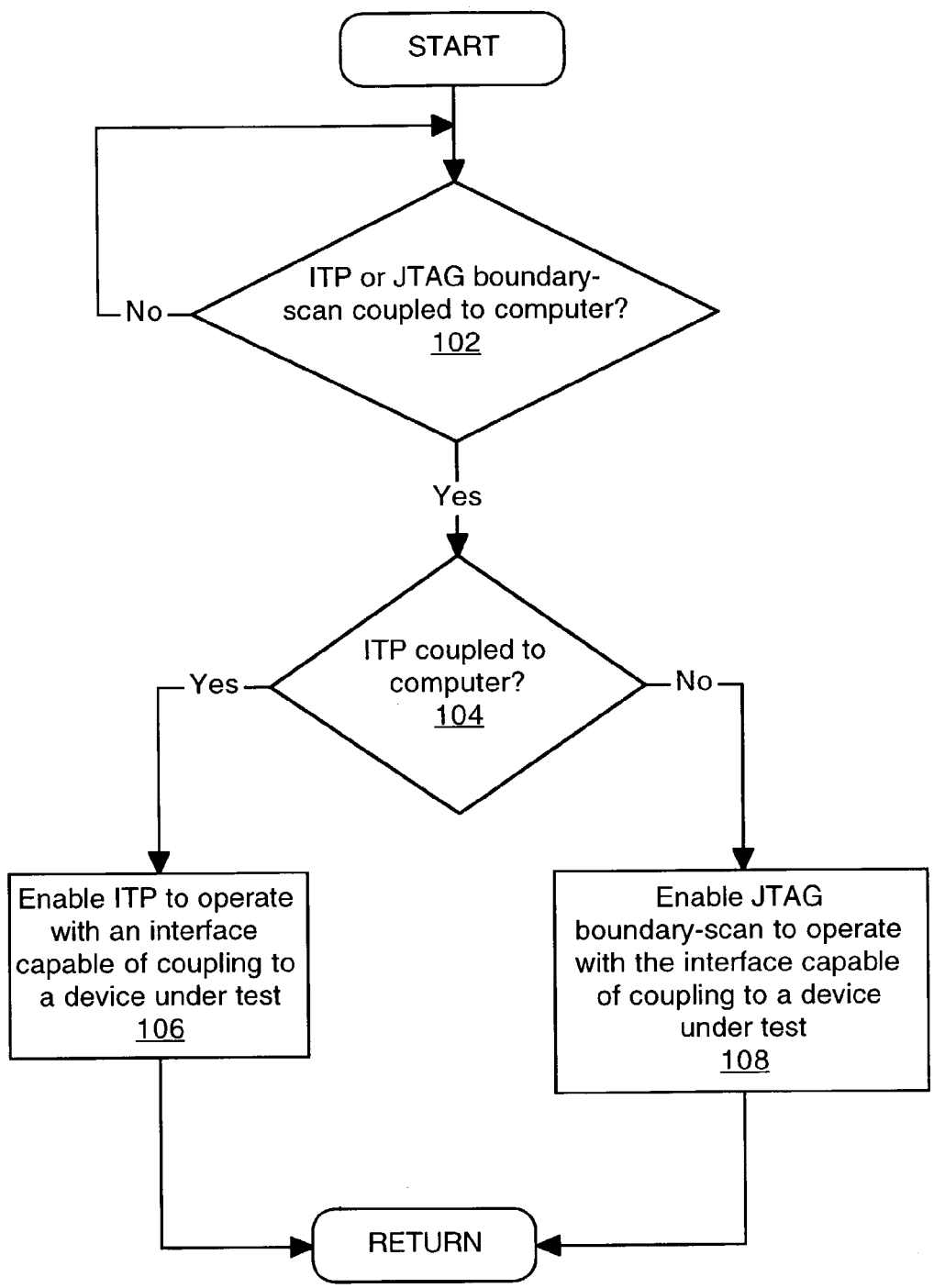
FIG. 1 is a flowchart of steps performed in accordance with an embodiment of the present invention for automatically enabling an Intel In-Target Probe (ITP) and a JTAG boundary-scan within a computer system.

Reference will now be made in detail to embodiments of the invention, examples of which are illustrated in the accompanying drawings. While the invention will be described in conjunction with embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be evident to one of ordinary skill in the art that the present invention may be practiced without these specific details. In other instances, well known methods, procedures, components, and circuits have not been described in detail as not to unnecessarily obscure aspects of the present invention.

Notation and Nomenclature

Some portions of the detailed descriptions which follow are presented in terms of procedures, logic blocks, processing, and other symbolic representations of operations on data bits within a computing system or digital system memory. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps may involve physical manipulations of physical quantities. Usually, though not necessarily, these physical manipulations take the form of electrical or magnetic signals capable of being stored, transferred, combined, compared, and otherwise manipulated in a computing system or similar electronic computing device. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, discussions utilizing terms such as "detecting", "supplying", "determining", "processing", "performing", "deciding", "ascertaining", "transmitting", "receiving", "retrieving", "providing", "presenting", "furnishing", "activating", "enabling", "capacitating", "recognizing", "generating", "utilizing", "implementing", "employing", "storing" or the like, refer to the action and processes of a computing system, or similar electronic computing device, that manipulates and transforms data. The data is represented as physical (electronic) quantities within the computing system's registers and memories and is transformed into other data similarly represented as physical quantities within the computing system's memories or registers or other such information storage, transmission, or display devices.

Exemplary Operations in Accordance with the Present Invention

FIG. 1 is a flowchart 100 of steps performed in accordance with an embodiment of the present invention for automatically enabling an Intel In-Target Probe (ITP) and a JTAG boundary-scan within a computer system. It is noted that the Intel ITP and the JTAG boundary-scan are provided as examples of two different testing technologies. As such, the present embodiment is not limited to these technologies. Flowchart 100 includes processes of the present invention which, in one embodiment, are carried out by a processor(s) and electrical components under the control of computer readable and computer executable instructions. The computer readable and computer executable instructions may reside, for example, in data storage features such as computer usable volatile memory, computer usable non-volatile memory and/or computer usable mass data storage. However, the computer readable and computer executable instructions may reside in any type of computer readable medium. Although specific steps are disclosed in flowchart 100, such steps are exemplary. That is, the present embodiment is well suited to performing various other steps or variations of the steps recited in FIG. 1. Within the present embodiment, it should be appreciated that the steps of flowchart 100 may be performed by hardware, by software or by any combination of software and hardware.

It is understood that JTAG boundary-scan (IEEE 1149.1) is a standard methodology for performing a variety of in-system operations that include testing of complicated Printed Circuit Assemblies (PCAs) that would otherwise receive poor test coverage due to high-density package integrated circuits (ICs) and complex PCA designs. Additionally, the JTAG boundary-scan can also perform in-system operations that include configuring programmable devices. It is noted that the JTAG boundary-scan is used pervasively across multiple platforms and architectures by major electronic manufacturers. Alternatively, the Intel In-Target Probe (ITP) is Intel's methodology for enabling lower-level processor and system debug functionality.

The present embodiment provides a method for automatically enabling an Intel ITP and a JTAG boundary-scan within a computer system. For example, a determination is made as to whether an ITP tool or a JTAG boundary-scan tool is coupled to the computer system. If so, it is further determined if the ITP tool is coupled to the computer system. If not, the present embodiment enables the JTAG boundary-scan tool to operate in conjunction with an interface of the computer system capable of coupling to a device under test. However, if the ITP tool is coupled to the computer system, the present embodiment enables it to operate in conjunction with the same interface of the computer system. In this manner, the present embodiment automatically detects whether the ITP tool or the JTAG boundary-scan tool is coupled to the computer system and enables, for example, the appropriate circuitry for correct operation of the tool. It is noted that this method may be performed without any user intervention or changes to system hardware and/or software. As such, an ITP tool or a JTAG boundary-scan tool may each be utilized in combination with the interface of the computer system that may be coupled to a device under test. The device under test may include, but is not limited to, one or more microprocessors and any other type of circuitry capable of being tested and/or configured.

At step 102 of FIG. 1, a determination is made as to whether an ITP tool or a JTAG boundary-scan tool is coupled to a computer system. If neither tool is coupled to the computer system, the present embodiment proceeds to the beginning of step 102. However, if the ITP tool or the JTAG boundary-scan tool is coupled to the computer system, the present embodiment proceeds to step 104. It is understood that the determination at step 102 of whether the ITP tool or the JTAG boundary-scan tool is coupled to the computer system may be performed in a wide variety of ways. For example, a particular voltage level, electrical difference and/or an electrical signal that identifies the ITP tool or the JTAG boundary-scan tool may be utilized to determine which device is coupled to the computer system.

It is noted that the computer system of the present embodiment may include, but is not limited to, a server, a desktop computer, a laptop computer or a portable computing device. It is understood that the ITP tool and the JTAG boundary-scan tool may each be coupled to the computer system utilizing a different type of adapter or connector. However, the present embodiment may be implemented in such a manner that the ITP tool and the JTAG boundary-scan tool may both be coupled to the computer system utilizing a common connector or adapter. Furthermore, it is appreciated that the ITP tool or the JTAG boundary-scan tool may be electrically coupled to the computer system.

In step 104, a determination is made as to whether the ITP tool is coupled to the computer system. If not, the present embodiment proceeds to step 108. However, if the ITP tool is coupled to the computer system at step 104, the present embodiment proceeds to step 106. In this manner, the present embodiment provides priority to a coupled ITP tool. However, it is appreciated that flowchart 100 may be modified such that it provides priority to a coupled JTAG boundary-scan tool. In that embodiment, step 104 would determine whether the JTAG boundary-scan tool is coupled to the computer system.

At step 106 of FIG. 1, the ITP tool is enabled to operate in conjunction with an interface of the computer system capable of coupling to a device under test. It is appreciated that the enabling of the ITP tool at step 106 may be implemented in a wide variety of ways. For example, the present embodiment may enable the appropriate circuitry for correct operation of the ITP tool. Furthermore, the present embodiment may supply one or more reference voltages or other signaling conditioning which enable the ITP tool signals to have the proper signaling characteristics in order to perform their desired functionality. For example, the signaling of the ITP tool may utilize a reference voltage level of 1.5V. Once step 106 is completed, the present embodiment exits flowchart 100.

At step 108, the JTAG boundary-scan tool is enabled to operate in conjunction with the interface of the computer system that may couple to a device under test. It is understood that the enabling of the JTAG boundary-scan tool at step 108 may be implemented in diverse ways. For example, the present embodiment may enable the appropriate circuitry for correct operation of the JTAG boundary-scan tool. Furthermore, the present embodiment may supply one or more reference voltages or other signaling conditioning which enable the JTAG boundary-scan tool signals to have the proper signaling characteristics in order to perform their desired functionality. For example, the signaling of the JTAG boundary-scan tool may utilize a reference voltage level of 3.3V. Once step 108 is completed, the present embodiment exits flowchart 100.

Figure 2:
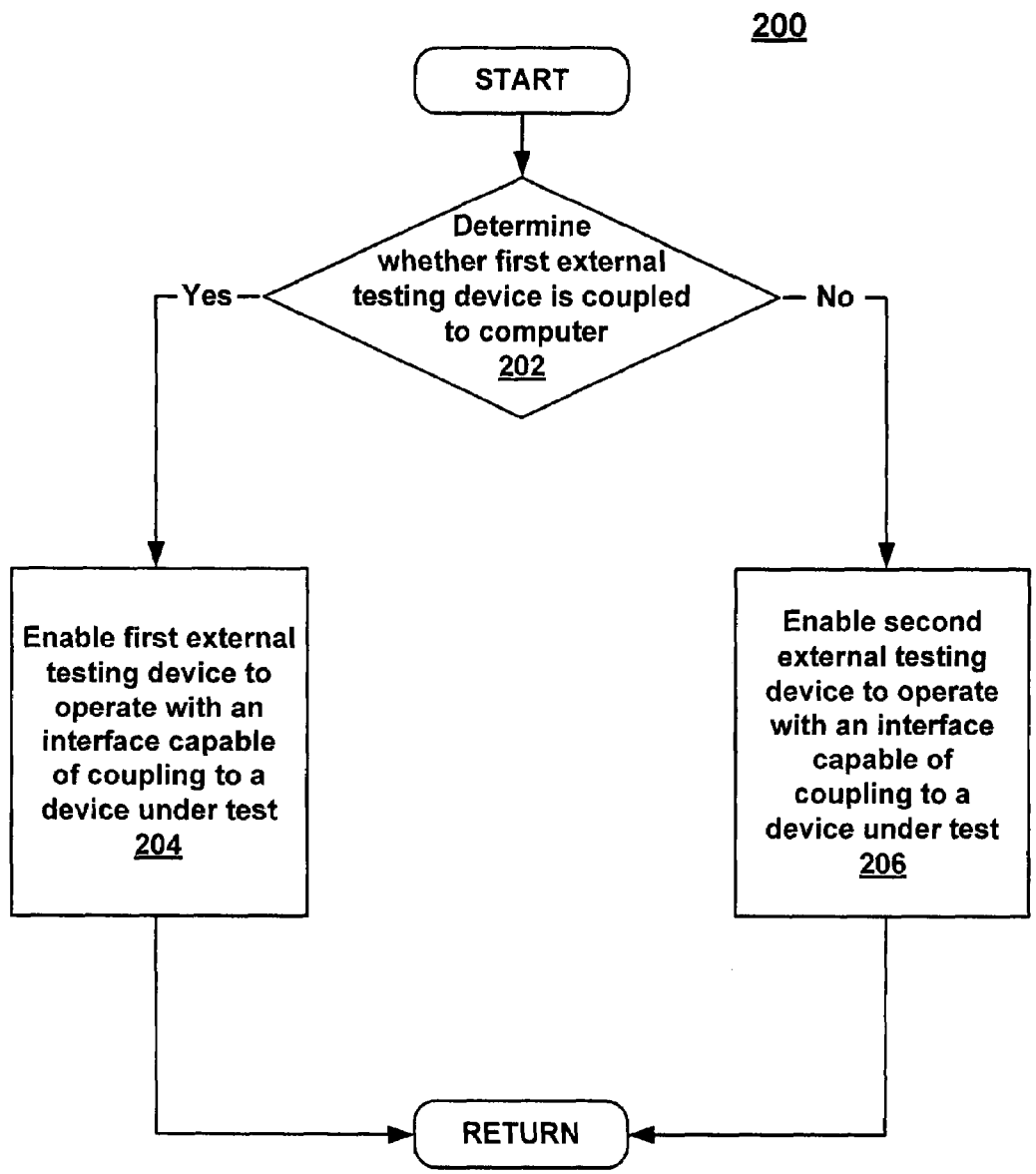
FIG. 2 is a flowchart of steps performed in accordance with an embodiment of the present invention for automatically enabling multiple testing devices of differing technologies within a computer system.

FIG. 2 is a flowchart 200 of steps performed in accordance with an embodiment of the present invention for automatically enabling multiple testing devices of differing technologies within a computer system. Flowchart 200 includes processes of the present invention which, in one embodiment, are carried out by a processor(s) and electrical components under the control of computer readable and computer executable instructions. The computer readable and computer executable instructions may reside, for example, in data storage features such as computer usable volatile memory, computer usable non-volatile memory and/or computer usable mass data storage. However, the computer readable and computer executable instructions may reside in any type of computer readable medium. Although specific steps are disclosed in flowchart 200, such steps are exemplary. That is, the present embodiment is well suited to performing various other steps or variations of the steps recited in FIG. 2. Within the present embodiment, it should be appreciated that the steps of flowchart 200 may be performed by hardware, by software or by any combination of software and hardware.

The present embodiment provides a method for automatically enabling multiple testing devices of differing technologies within a computer system. For example, a determination is made as to whether a first testing device of a given technology or a second testing device of a different technology is coupled to the computer system. If a first testing device is coupled to the computer system, the present embodiment enables it to operate with an interface of the computer system capable of being coupled to a device under test. However, if a second testing device is coupled to the computer system, the present embodiment enables it to operate with the interface of the computer capable of coupling to a device under test. In this manner, the present embodiment automatically detects whether the first testing device or the second testing device is coupled to the computer system and enables, for example, the appropriate circuitry for correct operation of the tool. It is noted that this method may all be performed without any user intervention or changes to system hardware and/or software. Therefore, a first testing device or a second testing device of differing technologies may each be utilized in combination with the same interface of the computer system for coupling to a device under test.

At step 202 of FIG. 2, it is determined whether a first testing device of a given technology or a second testing device of a different technology is coupled to a computer system. If a first testing device is coupled to the computer system, the present embodiment proceeds to step 204. However, if a second testing device is coupled to the computer system, the present embodiment proceeds to step 206. It is appreciated that the determination at step 202 of whether the first testing device or the second testing device is coupled to the computer system may be performed in diverse ways. For example, a particular voltage level, electrical difference and/or an electrical signal that identifies the first testing device or the second testing device may be utilized to indicate which tool is coupled to the computer system.

It is noted that the computer system of the present embodiment may be implemented in diverse ways. For example, the computer system may include, but is not limited to, a server, a desktop computer, a laptop computer or a portable computing device. It is understood that the first testing device and the second testing device may each be coupled to the computer system utilizing a different type of adapter, connector or interface. However, the present embodiment may be implemented in such a manner that the first testing device (e.g., an ITP tool) and the second testing device (e.g., a JTAG boundary-scan tool) may both be coupled to the computer system utilizing a common connector, interface or adapter. Additionally, it is appreciated that the first testing device and the second testing device may be electrically coupled to the computer system.

In step 204 of FIG. 2, the first testing device is capacitated to operate with an interface of the computer system capable of coupling to a device under test. It is appreciated that the capacitating of the first testing device at step 204 may be implemented in diverse ways. For example, the present embodiment may capacitate the appropriate circuitry and/or software for correct operation of the first testing device. Furthermore, the present embodiment may supply or provide one or more reference voltages or signal conditioning which capacitate the first testing device signals to have the proper signaling characteristics in order to perform their desired functionality. Once step 204 is completed, the present embodiment exits flowchart 200.

At step 206, the second testing device is capacitated to operate with the interface of the computer system that may be coupled to a device under test. It is understood that the capacitating of the second testing device at step 206 may be implemented in a wide variety of ways. For example, the present embodiment may enable the appropriate circuitry and/or software for correct operation of the second testing device. Furthermore, the present embodiment may supply or provide one or more reference voltages or signal conditioning which enable the second testing device signals to have the proper signaling characteristics in order to perform their desired functionality. Once step 206 is completed, the present embodiment exits flowchart 200.

Exemplary Hardware in Accordance with the Present Invention

Figure 3:
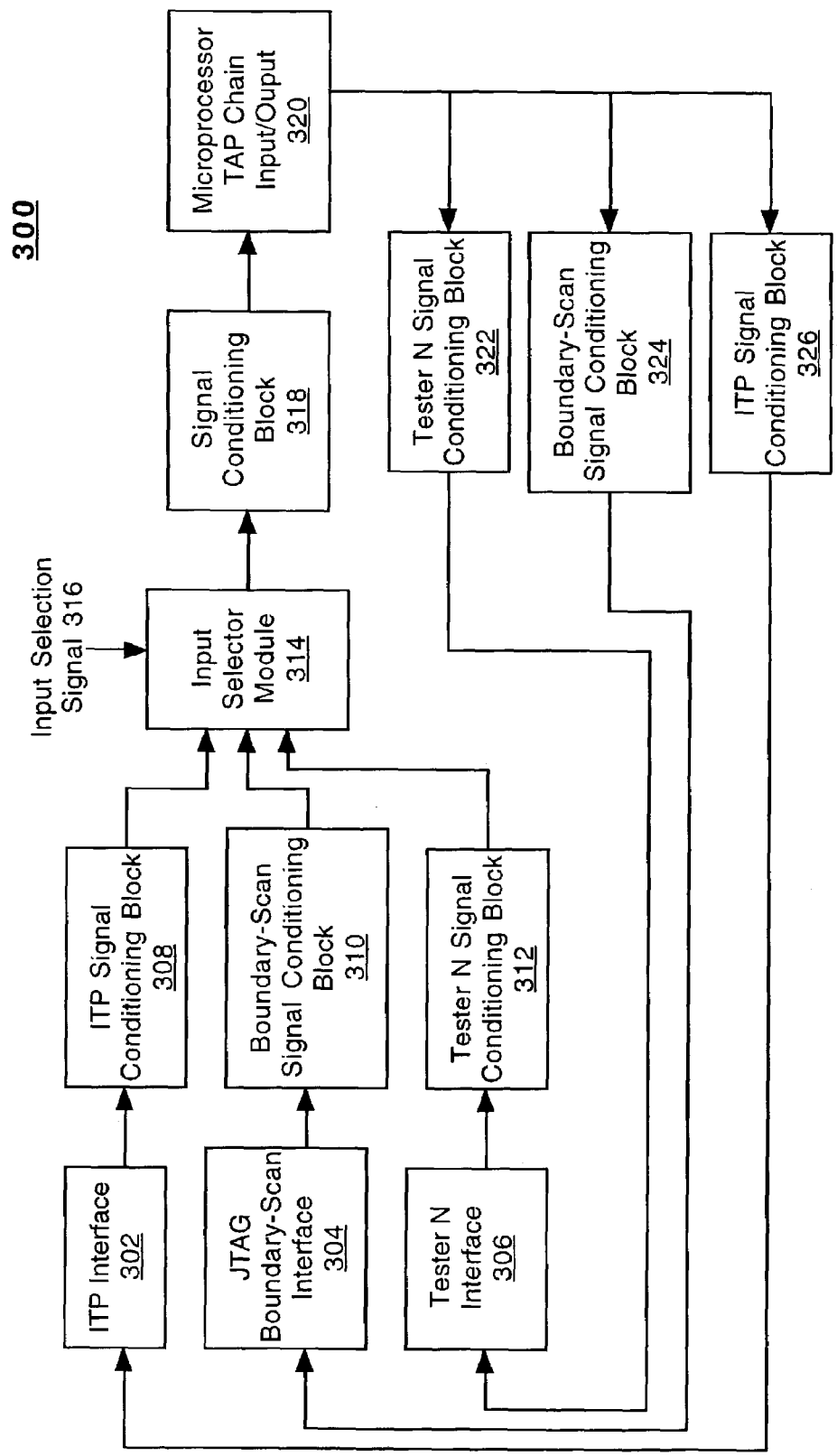
FIG. 3 is a block diagram of exemplary system that may be utilized to automatically enable multiple testing technologies within a computer system in accordance with an embodiment of the present invention.

FIG. 3 is a block diagram of exemplary system 300 that may be utilized to automatically enable multiple testing technologies within a computer system (e.g., 500 of FIG. 5) in accordance with an embodiment of the present invention. For example, an input selector module 314 makes a determination as to whether an ITP tool, a JTAG boundary-scan tool, or a tester N tool is coupled to the computer system. It is noted that "tester N" represents one or more arbitrary testing technologies that may be implemented as part of system 300. Within the present embodiment, the input selector module 314 automatically determines whether an ITP tool is coupled to an ITP interface 302, whether a JTAG boundary-scan tool is coupled to a JTAG boundary-scan interface 304 or whether a tester N tool is coupled to a tester N interface 306. Depending on which testing tool is coupled to system 300, the appropriate circuitry and/or software for supporting the proper operation of that testing tool is activated.

Specifically, if an ITP tool is coupled to the ITP interface 302, an ITP signal conditioning block 308 is activated which may include the appropriate circuitry and/or software for supporting the proper operation of the ITP tool within system 300. It is noted that the ITP signal conditioning block 308 of the present embodiment may be implemented in a wide variety of ways. For example, the ITP signal conditioning block 308 may supply one or more reference voltages (e.g., 1.5V) and/or signal conditioning in order to capacitate ITP Test Access Port (TAP) input signals to have the proper signaling characteristics in order to perform their desired functionality.

Subsequently, ITP TAP signals having the proper signaling characteristics are output by the ITP signal conditioning block 308 to the input selector module 314.

Within FIG. 3, if a JTAG boundary-scan tool is coupled to the JTAG boundary-scan interface 304, a boundary-scan signal conditioning block 310 is activated which may include the appropriate circuitry and/or software for supporting the proper operation of the JTAG boundary-scan tool. The JTAG boundary-scan signal conditioning block 310 may be implemented in diverse ways in accordance with the present embodiment. For example, the boundary-scan signal conditioning block 310 may supply one or more reference voltages (e.g., 3.3V) and/or signal conditioning in order to capacitate boundary-scan TAP input signals to have the proper signaling characteristics in order to perform their desired functionality. Subsequently, boundary-scan TAP signals having the proper signaling characteristics are output by the boundary-scan signal conditioning block 310 to the input selector module 314. It is understood that the JTAG boundary-scan signal conditioning block 310 and the ITP signal conditioning block 308 may account for electrical signaling level discrepancies between the ITP TAP signal level (e.g., 1.5V) and the boundary scan TAP signal level (e.g., 3.3V).

Within the present embodiment, it is noted that the tester N signal conditioning block 312 operates in a manner similar to the boundary-scan signal conditioning block 310 or the ITP signal conditioning block 308. For example, if a tester N tool is coupled to the tester N interface 306, the tester N signal conditioning block 312 is activated which may include the appropriate circuitry and/or software for supporting the proper operation of the tester N tool. The tester N signal conditioning block 312 may be implemented in a wide variety of ways in accordance with the present embodiment. For example, the tester N signal conditioning block 312 may supply one or more reference voltages and/or signal conditioning in order to capacitate tester N signals to have the proper signaling characteristics in order to perform their desired functionality. Subsequently, tester N signals having the proper signaling characteristics are output by the tester N signal conditioning block 312 to the input selector module 314.

Within FIG. 3, the input selector module 314 is coupled to receive an input selection signal 316 which may be generated when a testing device (e.g., ITP tool, JTAG boundary-scan tool, tester N tool, etc.) is coupled to the system 300 via an interface (e.g., 302, 304 or 306). For example, if the selection signal 316 indicates that an ITP tool has been coupled to the ITP interface 302, the input selector module 314 receives signal 316 and allows the ITP TAP input signals to be output to the signal conditioning block 318. Furthermore, when the input selector module 314 receives the selection signal 316 indicating a JTAG boundary-scan tool has been coupled to boundary-scan interface 304, the input selector module 314 allows the JTAG TAP input signals to be output to the signal conditioning block 318. It is appreciated that the input selector module 314 operates in a similar manner when it receives the selection signal 316 indicating a tester N tool has been coupled to tester N interface 306.

The input selector module 314 may utilize a wide variety of ways to automatically determine whether an ITP tool is coupled to ITP interface 302, a JTAG boundary-scan tool is coupled to boundary-scan interface 304 or a tester N tool is coupled to tester N interface 306. For example, a particular voltage level, electrical difference and/or an electrical signal that identifies the ITP tool, the JTAG boundary-scan tool or the tester N tool may be received from ITP interface 302, boundary-scan interface 304 and tester N interface 306, respectively, and identified by input selector 314. In one embodiment, the input selector 314 may be implemented such that it provides priority to a particular testing device, such as, an ITP tool coupled to ITP interface 302. In that situation, if another testing device (e.g., JTAG boundary-scan tool) is coupled to its appropriate interface (e.g., boundary-scan interface 304), the input selector 314 basically ignores it and continues to support the coupled ITP tool. It is appreciated that in another embodiment the input selector 314 may be implemented such that it provides priority to a JTAG boundary-scan tool or tester N device when coupled to its corresponding interface.

Within FIG. 3, the signals output by the input selector module 314 are received by an optional signal conditioning block 318 which cleans up the received signals (if needed) and then outputs them to a microprocessor TAP chain input/output 320. Within the present embodiment, the microprocessor TAP chain input/output 320 is an interface of system 300 capable of coupling to a device under test. The device under test coupled to the microprocessor TAP chain input/output 320 may include, but is not limited to, one or more microprocessors and any type of electrical circuitry that may be tested or configured. The microprocessor TAP chain input/output 320 may be implemented in a wide variety of ways in accordance with the present embodiment. For example, the microprocessor TAP chain input/output 320 may be implemented as a processor socket capable of electrically coupling system 300 to processors having different architectures.

The signals output by the microprocessor TAP chain input/output 320 are received by a tester N signal conditioning block 322, a boundary-scan signal conditioning block 324 and an ITP signal conditioning block 326. The tester N signal conditioning block 322, boundary-scan signal conditioning block 324 and ITP signal conditioning block 326 may each include the appropriate circuitry and/or software for conditioning the received signals to have the proper signaling characteristics in order to perform their desired functionality at their corresponding interface (e.g., 302, 304 and 306). For example, the ITP signal conditioning block 326 may supply one or more reference voltages (e.g., 1.5V) and/or signal conditioning in order to capacitate ITP TAP output signals for reception by ITP interface 302. It is appreciated that the tester N signal conditioning block 322 and boundary-scan signal conditioning block 324 operate in a manner similar to the ITP signal conditioning block 326 for their respective testing technology. Furthermore, it is noted that the tester N signal conditioning block 322, boundary-scan signal conditioning block 324 and ITP signal conditioning block 326 may be implemented in diverse ways in accordance with the present embodiment.

Within FIG. 3, an output of the ITP interface 302 is coupled to an input of the ITP signal conditioning block 308 while an output of the JTAG boundary-scan interface 304 is coupled to an input of the JTAG boundary-scan signal conditioning block 310. Additionally, an output of the tester N interface 306 is coupled to an input of the tester N signal conditioning block 312. An output of the ITP signal conditioning block 308, an output of the boundary-scan signal conditioning block 310, and an output of the tester N signal conditioning block 312 are each coupled to the input selector module 314. An output of the input selector module 314 is coupled to an input of the signal conditioning block 318. An output of the signal conditioning block 318 is coupled to an input of the microprocessor TAP chain input/out 320. It is noted that the microprocessor TAP chain input/out 320 of the present embodiment is an exemplary interface for coupling to a device under test. For example, the microprocessor TAP chain input/out 320 may be substituted with any type of interface for coupling to, but not limited to, circuitry and/or programmable devices that may interact with a testing and/or configuring technology such as ITP and/or JTAG boundary-scan.

An output of the microprocessor TAP chain input/out 320 is coupled to an input of the tester N signal conditioning block 322, an input of the boundary-scan signal conditioning block 324 and an input of the ITP signal conditioning block 326. Furthermore, an output of the tester N signal conditioning block 322 is coupled to an input of the tester N interface 306 while an output of the JTAG boundary-scan signal conditioning block 324 is coupled to an input of the boundary-scan interface 304. An output of the ITP signal conditioning block 326 is coupled to an input of the ITP interface 302.

Within FIG. 3, it is noted that the ITP signal conditioning block 308, boundary-scan signal conditioning block 310, tester N signal conditioning block 312, signal conditioning block 318, tester N signal conditioning block 322, JTAG boundary-scan signal conditioning block 324 and ITP signal conditioning block 326 may each be implemented with, but are not limited to, hardware and/or software.

Figure 4:
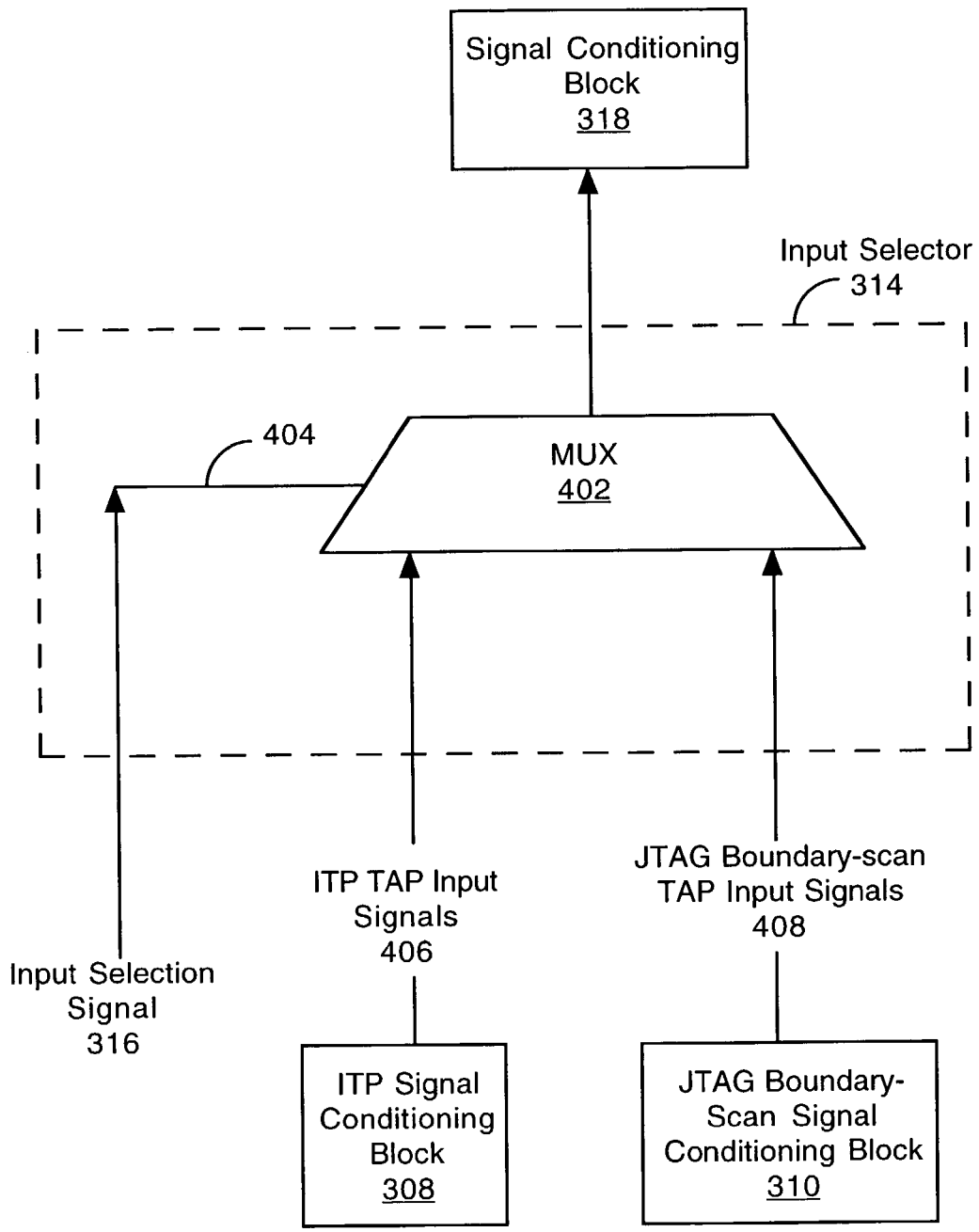
FIG. 4 is a block diagram of exemplary hardware that may be utilized to implement an input selector module in accordance with an embodiment of the present invention.

FIG. 4 is a block diagram of exemplary hardware that may be utilized to implement an input selector module (e.g., 314) in accordance with an embodiment of the present invention. Within the present embodiment, the input selector module 314 includes a multiplexer (MUX) 402 which is coupled to ITP signal conditioning block 308 thereby enabling reception of ITP TAP input signals 406. Moreover, MUX 402 is also coupled to JTAG boundary-scan signal conditioning block 310 thereby enabling reception of JTAG TAP input signals 408. A selector input 404 of MUX 402 is coupled to receive the selection signal 316 which may be generated when a testing device (e.g., ITP tool, JTAG boundary-scan tool, etc.) is coupled to the system 300 via an interface (e.g., 302, 304 or 306).

For example, if the selection signal 316 indicates that an ITP tool has been coupled to the ITP interface 302, the MUX selector input 404 receives signal 316 and allows the ITP TAP input signals 406 to be output to the signal conditioning block 318. Conversely, when the MUX selector input 404 does not receive this selection signal 316, the MUX 402 allows the JTAG TAP input signals 408 (if any) to be output to the signal conditioning block 318. In this manner, MUX 402 provides priority to the ITP tool when it is coupled to the ITP interface 302 and defaults to the JTAG boundary-scan when the ITP tool is not coupled to the ITP interface 302. However, it is understood that the present embodiment may be modified in order to provide priority to another testing device (e.g., JTAG boundary-scan tool, tester N) when it is coupled to its associated interface (e.g., 304 or 306). Within the present embodiment, the MUX 402 automatically detects whether an ITP tool or a JTAG boundary-scan tool is coupled to the system 300.

Within FIG. 4, it is noted that the MUX 402 of input selector 314 has been specifically implemented to receive input signals from an ITP tool or a JTAG boundary-scan tool. However, it is understood that the present embodiment of the input selector 314 may be modified in order to receive input signals from more than two testing technologies.

Figure 5:
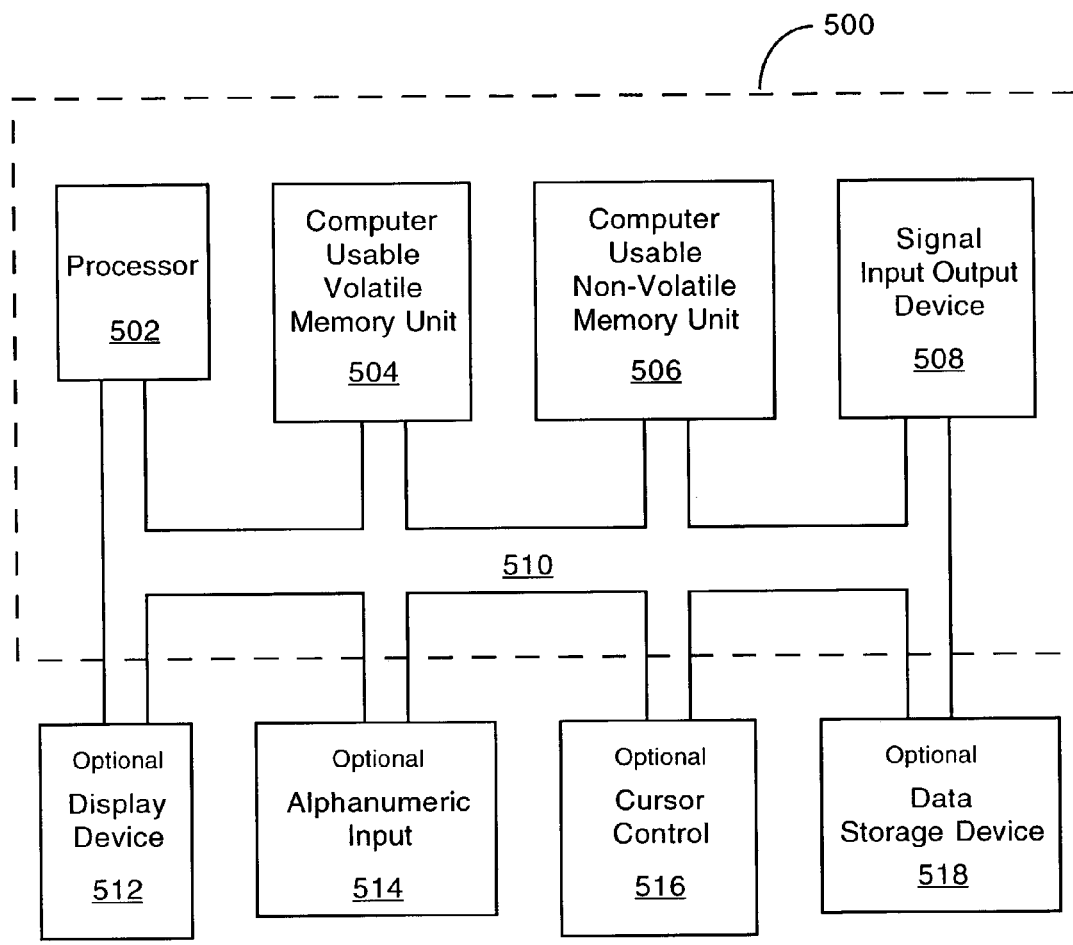
FIG. 5 is a block diagram of an embodiment of an exemplary computer system that may be used in accordance with the present invention.

FIG. 5 is a block diagram of an embodiment of an exemplary computer system 500 that may be used in accordance with the present invention. It is understood that system 500 is not strictly limited to be a computer system. As such, system 500 of the present embodiment is well suited to be any type of computing device (e.g., server computer, desktop computer, laptop computer, portable computing device, etc.). It is noted that system 300 of FIG. 3 may be implemented as part of computer system 500.

Computer system 500 of FIG. 5 comprises an address/data bus 510 for communicating information, one or more central processors 502 coupled with bus 510 for processing information and instructions. Central processor unit(s) 502 may be a microprocessor or any other type of processor. The computer 500 also includes data storage features such as a computer usable volatile memory unit 504, e.g., random access memory (RAM), static RAM, dynamic RAM, etc., coupled with bus 510 for storing information and instructions for central processor(s) 502, a computer usable non-volatile memory unit 506, e.g., read only memory (ROM), programmable ROM, flash memory, erasable programmable read only memory (EPROM), electrically erasable programmable read only memory (EEPROM), etc., coupled with bus 510 for storing static information and instructions for processor(s) 502.

System 500 also includes one or more signal generating and receiving devices 508 coupled with bus 510 for enabling system 500 to interface with other electronic devices. The communication interface(s) 508 of the present embodiment may include wired and/or wireless communication technology. For example, in one embodiment of the present invention, the communication interface 508 is a serial communication port, but could also alternatively be any of a number of well known communication standards and protocols, e.g., a Universal Serial Bus (USB), an Ethernet adapter, a FireWire® (IEEE 1394) interface, a parallel port, a small computer system interface (SCSI) bus interface, an infrared (IR) communication port, a Bluetooth® wireless communication adapter, a broadband connection, and the like. In another embodiment, a digital subscriber line (DSL) connection may be employed. In such a case the communication interface(s) 508 may include a DSL modem. Additionally, the communication interface(s) 508 may provide a communication interface to the Internet.

Optionally, computer system 500 can include an alphanumeric input device 514 including alphanumeric and function keys coupled to the bus 510 for communicating information and command selections to the central processor(s) 502. The computer 500 can also include an optional cursor control or cursor directing device 516 coupled to the bus 510 for communicating user input information and command selections to the processor(s) 502. The cursor directing device 516 can be implemented using a number of well known devices such as a mouse, a track ball, a track pad, an optical tracking device, a touch screen, etc. Alternatively, it is appreciated that a cursor can be directed and/or activated via input from the alphanumeric input device 514 using special keys and key sequence commands. The present embodiment is also well suited to directing a cursor by other means such as, for example, voice commands.

The system 500 of FIG. 5 can also include an optional computer usable mass data storage device 518 such as a magnetic or optical disk and disk drive (e.g., hard drive or floppy diskette) coupled with bus 510 for storing information and instructions. An optional display device 512 is coupled to bus 510 of system 500 for displaying video and/or graphics. It should be appreciated that optional display device 512 may be a cathode ray tube (CRT), flat panel liquid crystal display (LCD), field emission display (FED), plasma display or any other display device suitable for displaying video and/or graphic images and alphanumeric characters recognizable to a user.

Accordingly, an embodiment of the present invention enables ITP and JTAG boundary-scan to be utilized on a system without user intervention or changes to hardware and/or software.

The foregoing descriptions of specific embodiments of the present invention have been presented for purposes of illustration and description. They are not intended to be exhaustive or to limit the invention to the precise forms disclosed, and it is evident many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method comprising:
   determining whether a first external testing device is coupled to a system;
   provided said first external testing device is coupled to said system, enabling said first external testing device to operate with an interface of said system capable of coupling to a device under test; and
   provided said first external testing device is not coupled to said system, enabling a second external testing device to operate with said interface of said system capable of coupling to said device under test.

2. The method as described in claim 1 wherein said determining comprises receiving a signal that is generated when said first external testing device is coupled to said system.

3. The method as described in claim 1 wherein said determining comprises utilizing a multiplexer.

4. The method as described in claim 1 wherein said determining comprises utilizing a multiplexer coupled to receive a signal associated with said first external testing device being coupled to said system.

5. The method as described in claim 1 wherein said enabling said first external testing device to operate with said interface of said system comprises utilizing a first signal conditioning to enable signaling associated with said first external testing device.

6. The method as described in claim 5 wherein said enabling said second external testing device to operate with said interface of said system comprises utilizing a second signal conditioning to enable signaling associated with said second external testing device.

7. The method as described in claim 1 wherein said first external testing device comprises an In-Target Probe device or a boundary-scan device.

8. The method as described in claim 1 wherein said first external testing device comprises an In-Target Probe device and said second external testing device comprises a boundary-scan device.

9. The method as described in claim 1 wherein said device under test is a microprocessor or electrical circuitry that can be configured.

10. A system comprising:
    means for ascertaining whether a first external testing device is coupled to a computer system;
    means for capacitating said first external testing device to operate with an interface of said computer system capable of coupling to a device under test, provided said first external testing device is coupled to said computer system; and
    means for capacitating a second external testing device to operate with said interface of said computer system, provided said first external testing device is not coupled to said computer system.

11. The system of claim 10 wherein said means for ascertaining involves receiving a particular voltage, electrical difference or electrical signal that identifies said first external testing device.

12. The system of claim 10 wherein said means for ascertaining comprises utilizing a multiplexer.

13. The system of claim 10 wherein said means for ascertaining comprises utilizing a multiplexer having a selector input coupled to receive a signal associated with said first external testing device being coupled to said computer system.

14. The system of claim 10 wherein said means for capacitating said first external testing device to operate with said interface of said computer system comprises supplying a first signal conditioning to enable signaling associated with said first external testing device.

15. The system of claim 14 wherein said means for capacitating said second external testing device to operate with said interface of said computer system comprises supplying a second signal conditioning to enable signaling associated with said second external testing device.

16. The system of claim 10 wherein said first external testing device comprises an In-Target Probe device or a boundary-scan device.

17. The system of claim 10 wherein said first external testing device comprises an In-Target Probe device and said second external testing device comprises a boundary-scan device.

18. The system of claim 10 wherein said device under test comprises a microprocessor.

19. A circuit comprising:
    a multiplexer coupled to determine whether a first external testing device is coupled to a computer system; and
    an enabler circuit coupled to said multiplexer, wherein said multiplexer for allowing said first external testing device to operate with an interface of said computer system capable of coupling to a device under test when said first external testing device is coupled to said computer system, said multiplexer also for allowing a second external testing device to operate with said interface of said compute system when said first external testing device is not coupled to said computer system.

20. The circuit of claim 19 wherein said multiplexer is coupled to receive a signal indicating said first external testing device is coupled to said computer system.

21. The circuit of claim 19 wherein said multiplexer is coupled to receive a signal indicating said second external testing device is coupled to said computer system.

22. The circuit of claim 19 wherein said enabler circuit for receiving input signals from said first external testing device or second external testing device.

23. The circuit of claim 19 wherein said multiplexer is coupled to receive input signals associated with said first external testing device or second external testing device from said enabler circuit.

24. The circuit of claim 19 wherein said multiplexer is coupled to output first external testing device signals or second external testing device signals.

25. The circuit of claim 19 wherein said first external testing device comprises an In-Target Probe device or a boundary-scan device.

26. The circuit of claim 19 wherein said first external testing device comprises an In-Target Probe device and said second external testing device comprises a boundary-scan device.

27. The circuit of claim 19 wherein said device under test is a microprocessor or electrical circuitry that can be configured.

* * * * *

UNITED STATES PATENT AND TRADEMARK OFFICE
CERTIFICATE OF CORRECTION

PATENT NO. : 7,469,370 B2
APPLICATION NO. : 10/328805
DATED : December 23, 2008
INVENTOR(S) : Dale J. Shidla et al.

It is certified that error appears in the above-identified patent and that said Letters Patent is hereby corrected as shown below:

In column 12, lines 51-52, in Claim 19, delete "compute system" and insert -- computer system --, therefor.

Signed and Sealed this

Fourteenth Day of April, 2009

JOHN DOLL
*Acting Director of the United States Patent and Trademark Office*